United States Patent [19]

Traa

[11] Patent Number: 4,774,498
[45] Date of Patent: Sep. 27, 1988

[54] ANALOG-TO-DIGITAL CONVERTER WITH ERROR CHECKING AND CORRECTION CIRCUITS

[75] Inventor: Einar O. Traa, Portland, Oreg.

[73] Assignee: Tektronix, Inc., Beaverton, Oreg.

[21] Appl. No.: 23,736

[22] Filed: Mar. 9, 1987

[51] Int. Cl.[4] .................. H03M 1/10; H03M 1/36
[52] U.S. Cl. ............................... 341/159; 341/120
[58] Field of Search .............. 340/347 AD, 347 CC

[56] References Cited

U.S. PATENT DOCUMENTS

| | | | |
|---|---|---|---|
| 4,183,016 | 1/1980 | Sawagata | 340/347 AD |
| 4,386,339 | 5/1983 | Henry | 340/347 AD |
| 4,456,904 | 6/1984 | van de Grift | 340/347 AD |

Primary Examiner—Charles D. Miller
Attorney, Agent, or Firm—Paul S. Angello; Robert S. Hulse

[57] ABSTRACT

An analog-to-digital converter (10) comprises a set of comparators (12a–12f) for providing a set of different output signals whose logic states are a function of an analog input signal voltage and one or more reference voltage signals supplied by a resistive network (16). The comparators are connected to a decoder (20) for processing the thermometer code outputs of the comparators to generate a digital word output corresponding to the voltage amplitude of the analog signal. Several of the comparators are also connected to an error checking network (22), including a preconditioning circuit (100) and a detection circuit (102) for processing these comparator outputs to provide an error signal whenever one or more of the comparators are not operating properly. The error checking network and decoder are connected to an error correction circuit (26) for correcting the digital word signal in accordance with the error signal. Also, comparator circuits are provided which are well-adapted for high-speed operation and error checking.

13 Claims, 9 Drawing Sheets

| A' | B' | C' | $b_0$ | ER | $b_0'$ | $b_1$ |
|----|----|----|----|----|----|----|
| 0 | 0 | 1 | 1 | 1 | 0 | 0 |
| 0 | 1 | 0 | 1 | 1 | 0 | 1 |
| 0 | 1 | 1 | 0 | 1 | 1 | 1 |
| 1 | 0 | 1 | 0 | 1 | 1 | 0 |
| 0 | 0 | 0 | 0 | 0 | 0 | 0 |
| 1 | 0 | 0 | 1 | 0 | 1 | 0 |
| 1 | 1 | 0 | 0 | 0 | 0 | 1 |
| 1 | 1 | 1 | 1 | 0 | 1 | 1 |

(First four rows: NOT ALLOWED)

FIG. 7

DECIMAL VALUE OF ACTUAL ANALOG VOLTAGE

| OUTPUT IN ERROR | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| A | (1) | (0) | X | X | (5) | (4) | X | X | (9) | (8) | X | X | (13) | (12) | X | X |
| B | X | (2) | (1) | X | X | (6) | (5) | X | X | (10) | (9) | X | X | (14) | (13) | X |
| C | X | X | (3) | (2) | X | X | (7) | (6) | X | X | (11) | (10) | X | X | (15) | (14) |
| D | (7) | X | X | (4) | (3) | X | X | (8/0)(7/15) | X | X | (12) | (11) | X | X | X | (8) |
| E | (8) | (9) | (10) | (11) | * | * | * | * | (0) | (1) | (2) | (3) | * | * | * | * |
| F | * | * | * | * | (12) | (13) | (14) | (15) | * | * | * | * | (4) | (5) | (6) | (7) |

ANALOG-TO-DIGITAL CONVERTER WITH ERROR CHECKING AND CORRECTION CIRCUITSCL BACKGROUND OF THE INVENTION

The present invention relates to parallel type or flash analog-to-digital converters and more specifically to analog-to-digital converters which include error checking and error correction circuits.

Flash analog-to-digital converters include a set of voltage comparators, each of which is furnished with the analog input signal and a different reference voltage. The outputs of the comparators form a "thermometer code" which is decoded to generate a digital word output corresponding to the voltage amplitude of the analog input signal.

However, the comparators used in such converters may sometimes be subject to offset errors relating, amount other things, to dynamic problems. Such errors can become especially troublesome in highspeed converters in which factors such as the bandwidths of individual comparators and the slew rates of the input signals can significantly affect the operation of the overall unit. Consequently, it would be desirable to provide an error checking and correction mechanism for use with high-speed converter circuits and further to provide comparator circuits adapted to allow efficient error detection.

Therefore, it is an object of the present invention to provide an efficient error checking circuit for a flash analog-to-digital converter and an error correction circuit for use in association with such an error checking circuit.

It is another object of the present invention to provide an analog-to-digital converter employing comparator circuitry adapted error checking and error correction.

It is a further object of the present invention to provide for an analog-to-digital converter which is constructed and arranged for high-speed operation yet is of efficient and simple design.

SUMMARY OF THE INVENTION

The present invention constitutes an analog- to-digital converter that comprises a set of parallel comparator circuits, a decoder, an error checking network, and an error correction circuit. The error checking network includes a preconditioning circuit and an error detection circuit. The preconditioning circuit generates a set of intermediate signals from the comparator output signals, which are characterized by waveforms having regularly repeating patterns of voltage transitions between logic states. The error detection circuit provides an error signal in response to combinations of these intermediate signals which would not be formed if the converter was operating properly.

In the preferred embodiment, the converter of the present invention employs high-speed comparator circuits including two or more differential amplifiers. The differential amplifiers are supplied with different reference voltages and are connected to two common differential output conductors with alternate amplifiers oppositely connected to the common output conductors. The comparators generate output signals which exhibit one or more ranges or "windows" over which the output signals assume one logic state. In the preferred embodiment, an error correction circuit is also provided which corrects the digital output signal of the converter in accordance with the error signals furnished by the error checking network.

An alternative arrangement is also provided for structuring the system of comparators used in the present invention along with corresponding changes required in the preconditioning circuit. The alternative system employs two sets of comparators in a "push-pull" configuration which receive the analog input signal and the inverse of the analog input signal.

DESCRIPTION OF THE PREFERRED EMBODIMENT

Figure 1:
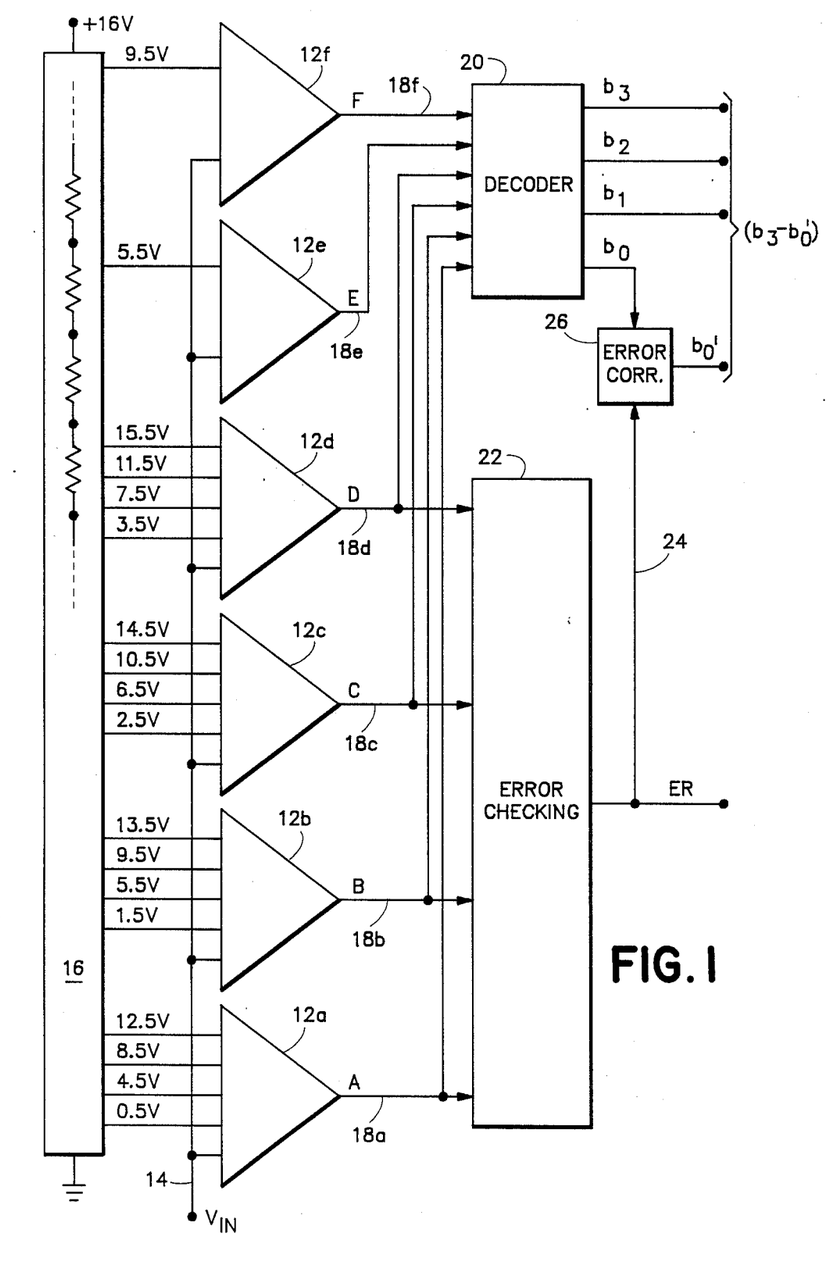
FIG. 1 is a block diagram of the overall converter circuit of the present invention.

Referring now to FIG. 1, the present invention comprises the analog-to-digital converter 10. The converter 10 includes the comparators 12a-12f which receive an analog input signal $V_{IN}$ on line 14 and a series of reference voltages from the reference ladder resistive network 16. The converter 10 is constructed to operate over a 16 volt input range and provide a four-bit digital binary output covering the range (binary 0,0,0,0–1,1,1,1; decimal 0–15) representing the amplitude of the input signal ±0.5 volt. The comparators 12a-12f provide respective output signals A–F, which are each separate functions of the voltage level of the analog input signal $V_{IN}$ and which together form a thermometer code output system. The signals A–F are supplied on the respective output lines 18a-18f to the decoder 20 and the error checking network 22. The decoder 20 converts the comparator output signals A–F to a digital binary word $b_3$-$b_0$ corresponding to the voltage amplitude of the analog input signal $V_{IN}$. The error checking network 22 processes the output signals A–D and provides an error signal ER when network 22 detects that an error exists among the comparator output signals A–D. The error signal ER is provided on line 24 to the correction circuit 26 which functions to correct the least significant bit $b_0$ of the digital word $b_3$-$b_0$ in accordance with the error signal ER.

Figure 5A:
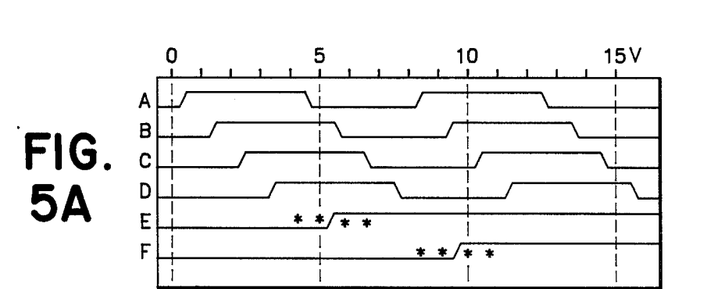
FIGS. 5A and 5B are charts depicting the waveforms for the logic states of the output signals of the comparators of FIG. 1 and the output signals of preconditioning circuit of FIG. 6, respectively.

Each of the comparators 12a-12f assumes one of two operation states in accordance with the level of the voltage of the analog input signal $V_{IN}$ and for any given voltage provides either a logic 1 state (high voltage) or a logic 0 state (low voltage) output signal. FIG. 5A shows how each of the output signals A–F changes over the input voltage range of the converter 10 which comprises the abscissa of the chart. The waveforms are elevated from baseline when the signals to which they correspond are in the logic 1 state and are at baseline when the signals to which they correspond are in the logic 0 state. The plots of the output signals A–D show four similar waveforms. Each waveform includes four logic state transitions and two ranges or "windows" over which the signals are in the logic 1 state. The ranges cover four volt intervals that are separated by a four volt gap. The ranges of the waveforms for the different output signals A–D cover different overlapping voltage intervals uniformly spaced-apart by one volt increments.

Figure 2:
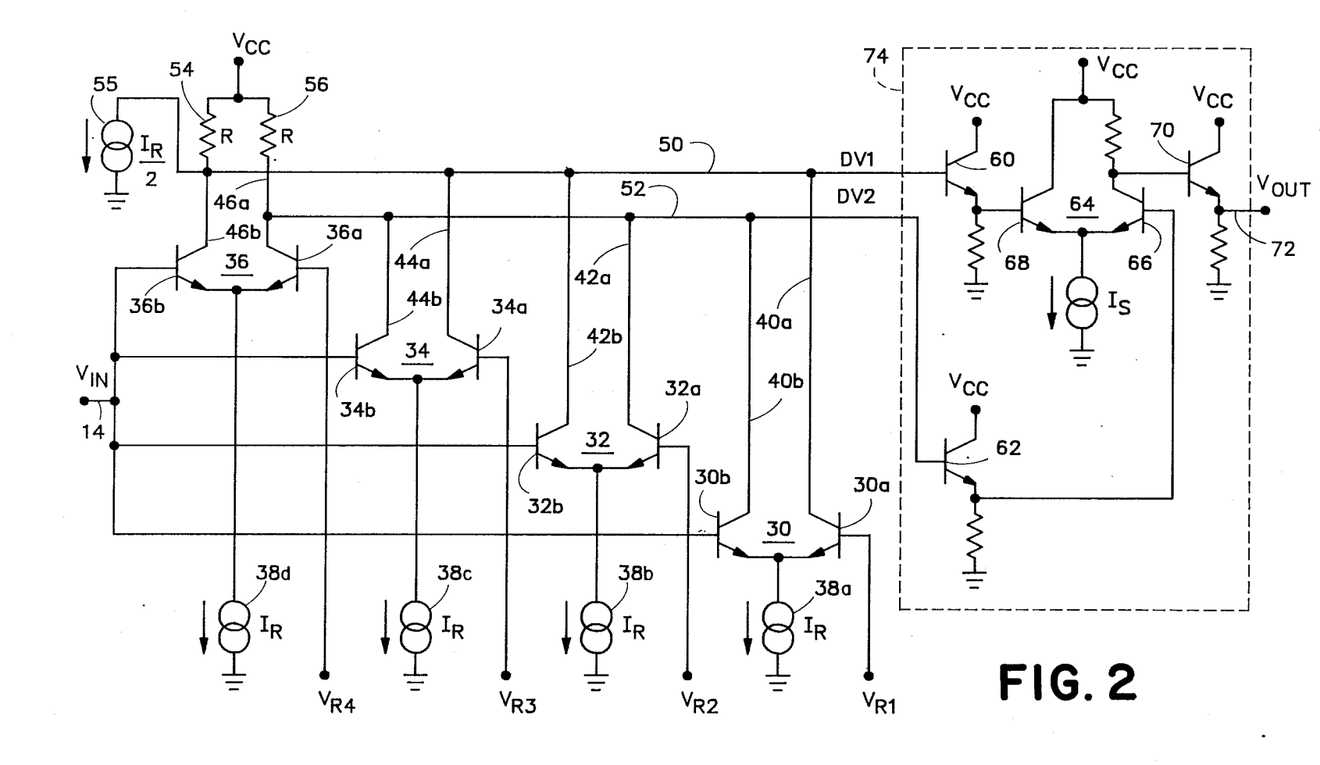
FIG. 2 is a schematic diagram of the circuitry for one comparator of the converter shown in FIG. 1.

Referring now to FIG. 2, a circuit is illustrated for the comparators 12a-12d which is suitable for high-speed operation. The comparators 12a-12d comprise four differential amplifiers 30, 32, 34, and 36 each of which includes two transistors 30a, 30b, 32a, 32b, 34a, 34b, 36a, and 36b. The transistors 30a, 32a, 34a, and 36a are connected to the resistive network 16 (FIG. 1) and receive reference voltages $V_{R1}$-$V_{R4}$, respectively, of increasing level separated by equal four volt increments. The transistors 30b, 32b, 34b, and 36b are connected to the analog input line 14 (FIG. 1) and receive the analog input signal $V_{IN}$. The emitter terminals of the transistors 30a, 30b, 32a, 32b, 34a, 34b, 36a, and 36b are coupled to constant current sources 38a-38d, respectively, which each supply a constant current $I_R$. The collector terminals 40a, 40b, 42a, 42b, 44a, 44b, 46a, and 46b of the respective transistors 30a, 30b, 32a, 32b, 34a, 34b, 36a, and 36b are connected to a pair of common differential output conductors 50 and 52. However, the collector terminals of the transistors receiving reference voltage signals and the transistors receiving the analog input signal are connected in alternate amplifiers (arranged by reference voltage level) to opposite output conductors. The collector terminals 40a, 42b, 44a, and 46b are connected to the conductor 50 while the collector terminals 40b, 42a, 44b, and 46a are connected to the conductor 52. The differential output conductor 50 is connected to a source of voltage $V_{CC}$ through the load resistor 54 of value "R" ohms and to a source 55 of constant current $I_R/2$. The differential output conductor 52 is similarly connected to the source of voltage $V_{CC}$ through the load resistor 56 also of value "R" ohms but is not connected to a constant current source.

Figure 3:
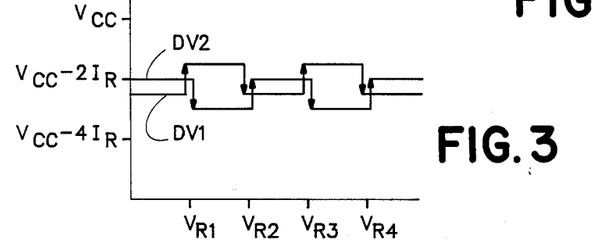
FIG. 3 is a chart depicting the voltage signals produced on the common differential output conductors for the differential amplifiers shown in FIG. 2.

The combination of oppositely connected collector terminals and the constant current source 55 operates to generate on the respective conductors 50 and 52 the output signals DV1 and DV2 which exhibit desirable voltage changes at the reference voltages $V_{R1}$, $V_{R2}$, $V_{R3}$, and $V_{R4}$ over the operation range of the converter 10. FIG. 3 illustrates this action with the voltage of the signals DV1 and DV2 plotted as a function of the analog input signal voltage along the abscissa and with the reference voltages specifically shown. At any given voltage for the analog input signal, the signals DV1 and DV2 are always at different voltage levels (i.e. $DV1 = V_{CC} - 5/2 I_R$ or $= V_{CC} - 3/2 I_R$; $DV2 = V_{CC} - 2 I_R$ or $= V_{CC} - 3 I_R$) and the comparative relationship between the signals (e.g., DV1>DV2 or DV2>DV1) always changes at the reference voltages.

The output conductors 50 and 52 are connected to the base terminals of the transistors 60 and 62, respectively, which are configured as emitter followers. The emitter terminals for the transistors 62 and 60 are separately connected to the base terminals of the transistors 66 and 68, respectively, of the differential amplifier 64. The amplifier 64 converts the differential signals DV1 and DV2 to a single output referenced to ground. This output is supplied from the collector terminal of the transistor 66 to the base terminal of the output transistor 70 which functions as a voltage level converter that furnishes the signal $V_{OUT}$ (which may be either A, B, C, or D) on line 72 as the final output of one of the comparators 12a-12d. The transistors 60, 66, 68, and 70 and their associated components form a buffer circuit 74 between the comparators 12a-12d and the circuits in the decoder 20 and error checking network, which are implemented in ECL components. The comparators 12f, 12e provide conventional step function output signals F, E and are of standard design suitable for this application.

Figure 4:
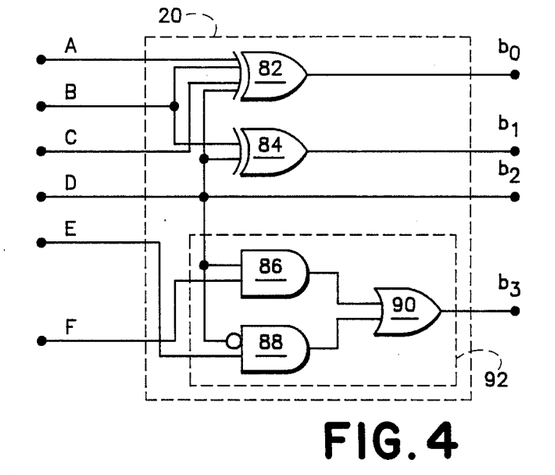
FIG. 4 is a schematic diagram of the circuitry for the decoder in FIG. 1.

Referring now to FIG. 4, the decoder 20 may take the form of the logic network which processes the inputs A–F to produce a digital binary word $b_3$-$b_0$. The decoder includes two EXCLUSIVE-OR gates 82 and 84 which provide the outputs $b_0$ and $b_1$ in response to the input signals A, B, C, and D and B and D, respectively. The input signal D forms the output $b_3$ without further processing. The decoder 20 also includes the circuit 92 comprising the AND gates 86 and 88 and an OR gate 90. The AND gates 86 and 88 receive the input signals D, F and E, $\overline{D}$, respectively. The OR gate 90 provides the output $b_3$ in response to the outputs of the AND gates 86 and 88. The bits $b_3$-$b_o$ of the digital word provided by the decoder may be expressed in the following logic functions: $b_3 = DF + \overline{D}E$, $b_2 = D$, $b_1 = B \oplus D$, $b_o = A \oplus B \oplus C \oplus D$.

Figure 6:
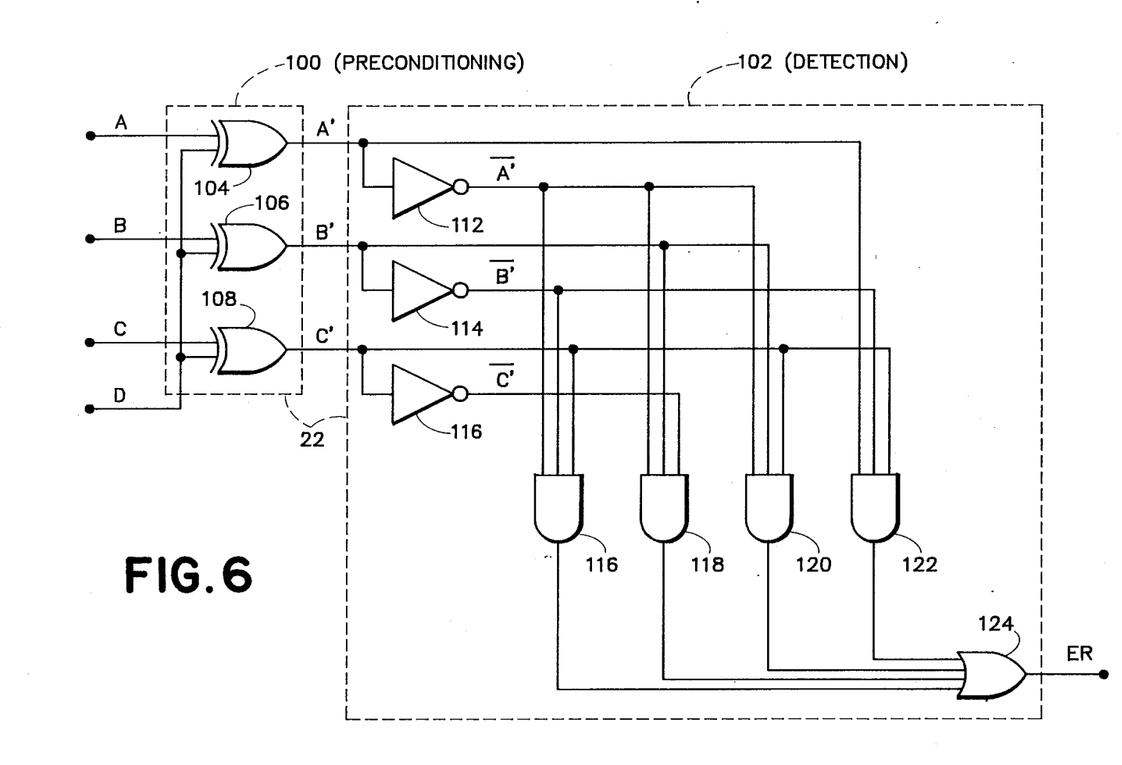
FIG. 6 is a schematic diagram of the circuitry for the error checking network shown in FIG. 1.

Referring now to FIG. 6, the error checking network 22 receives the output signals A, B, C, and D of the respective comparators 12a-12d (FIG. 1) and provides the error signal ER. The network 22 may be usefully viewed as comprising a preconditioning circuit 100 and a detection circuit 102. The preconditioning circuit 100 includes three EXCLUSIVE-OR gates 104, 106, 108 which receive the signals A and D, B and D, and C and D, respectively, and provide the intermediate output signals $A'=A \oplus D$, $B'=B \oplus D$ $C'=C \oplus D$. The preconditioning circuit 100 may be considered as a programmable inverter of the output signals A, B, and C whose logic states are a function of the logic state of the output signal D, which in the logic 1 state inverts the logic states of signals A, B, and C and in the logic 0 state leaves unchanged the logic states of the signals A, B, and C.

Figure 5B:
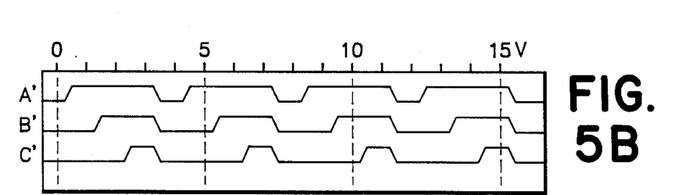

The waveforms for the outputs A', B', C' are diagrammatically illustrated over the operational range 0 to +15 volts of the converter 10 along the abscissa in FIG. 5B. These waveforms reflect the information contained in the signals A, B, C, and D and are beneficially structured for error detection. The waveforms of the intermediate signals A', B', C' are characterized by repeating cycles or patterns of voltage transitions over four-volt intervals. The signals A', B', C' change to logic state 1 at different uniformily spaced-apart voltage levels (e.g., at 1, 2, and 3 volts, respectively) and change to logic state 0 at the same voltage level (e.g., at 4 volts). As a result, the signals A', B', and C' can properly assume only a limited number of combinations over the voltage range of the converter 10. Therefore, the existence of certain errors can be discovered by detecting combinations of the signals A', B', and C' which should not occur in accordance with the proper operation of the converter 10.

Figure 7:
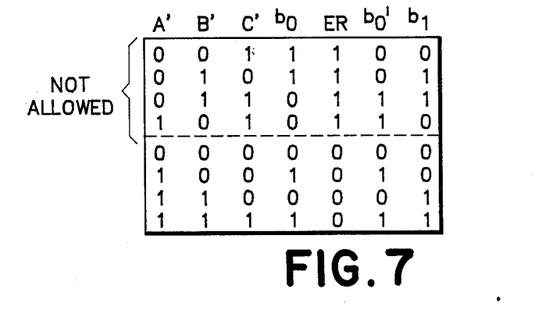
FIG. 7 is a chart depicting the different combinations of signals produced by the preconditioning circuit and error detection circuit of FIG. 6 and the error correction of FIG. 8.

The chart in FIG. 7 shows all the combinations of A', B', and C' along with the logic state for the least significant bit $b_o$ of the digital binary word from the decoder 20. The first four rows of entries correspond to "not allowed" combinations of the signals A', B', C' which would not occur if the comparators 12a-12d of the converter 10 were operating properly. The detection circuit 102 detects these combinations and provides the signal ER whenever such combinations occur. The circuit 102 includes three inverters 112, 114, and 116 for forming the complements of the signals A', B', and C'. The AND gates 116, 118, 120, and 122 separately provide logic 1 signals whenever $\overline{A'}\overline{B'},C'=1$, $\overline{A'}B'/\overline{C'}=1$, $\overline{A'}B'C'=1$ and $A'B'C'=1$ (representing not allowed combinations). These signals are provided to the OR gate 124 which supplies a logic 1 state signal ER whenever one of the gates 116, 118, 120 or 122 supplies it with a logic 1 state signal. Consequently, the ER signal furnishes an indication of an error in the operation of one of comparators 12a-12d and the existence of an incorrect digital binary word.

Figure 10:
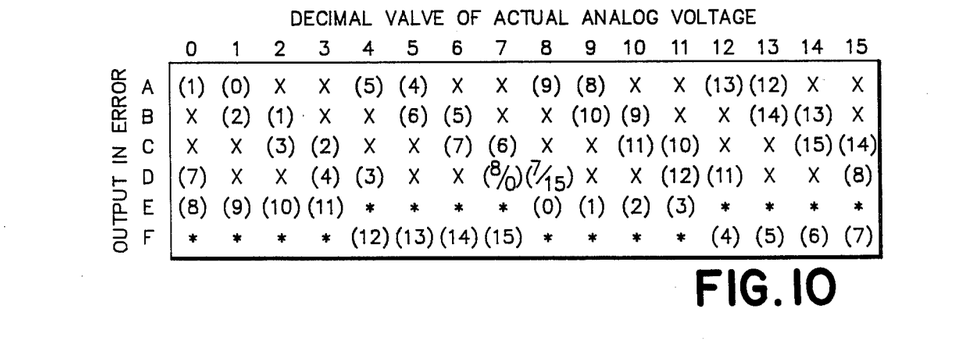
FIG. 10 is a chart depicting the occurrence of detectable and nondetectable errors over the operational range of the present invention.

The chart of FIG. 10 provides a summary of the conditions under which detectable and nondetectable errors occur over the analog input signal range of the converter 10. For purposes of simplicity, the entries in the chart are based upon the assumption that only single errors occur in the output signals A-F and that the errors affect the least significant bit. The "X" entries represent conditions under which not allowed combinations of outputs occur which are detectable by the error checking network 22. The numeric entries represent the decimal values for the digital words produced when errors occur which provide allowed combinations of outputs and which are, therefore, not detectable. As may be apparent from the chart, approximately fifty percent of the errors in the signals A-D are detectable and, with respect to the vast majority of non-detectable errors, only an error of one least significant bit results.

Figure 8:
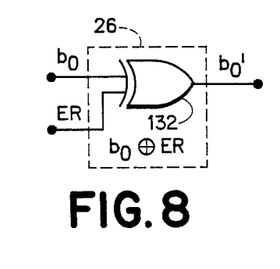
FIG. 8 is a schematic diagram of the circuitry for the error correction circuit shown in FIG. 1.
Figure 9A:
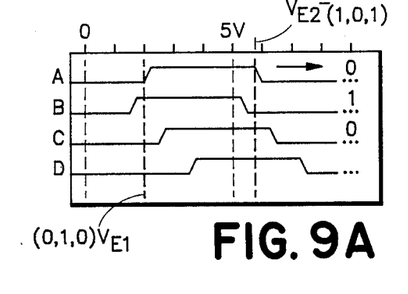
FIGS. 9A-9D are charts depicting the waveforms associated with the most common types of errors in the signals of the comparators of FIG. 1.
Figure 9B:
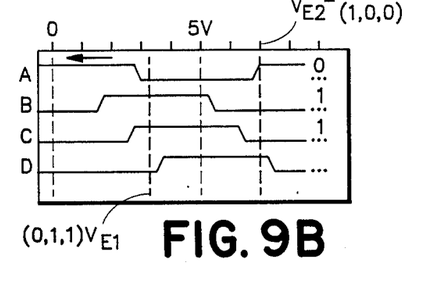
Figure 9C:
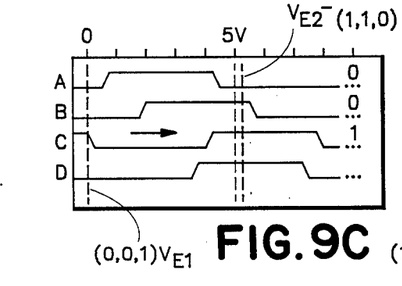
Figure 9D:
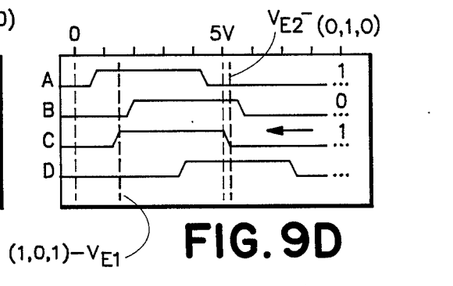

Referring now to FIG. 8, the circuit 26 is shown as including the EXCLUSIVE-OR gate 132. The gate 132 receives the signals $b_o$ and ER and provides the corrected signal $b_o'$ in accordance with the logic function $b_o'=b_o \oplus ER$. Whenever the error signal ER is in the logic 1 state, the gate 132 inverts the signal $b_o$ to generate $b_o'=\overline{b_o}$. FIGS. 9A-9D illustrate waveforms associated with the types of errors which would be expected to be most frequently encountered in the operation of the converter 10. These errors can be seen to correspond to not allowed combinations of the signals A-D which are detectable by the error checking network 22. In FIG. 9A, the signal A is offset to the right and the comparator 12a is operating at a higher reference voltage level than desired. In FIG. 9B, the signal A is offset to the left and the comparator 12a is operating at a lower reference voltage level than desired. In FIG. 9C, the signal C is offset to the right and the comparator 12c is operating at a higher reference voltage level than desired. In FIG. 9D, the signal C is offset to the left and the comparator 12c is operating at a lower reference voltage level than desired.

Each one of these offset situations correlates with two different types of error-indicating combinations of the signals A-C. However, these combinations happen to be complements of one another. The combinations are shown adjacent to exemplary levels of voltage $V_{E1}$ and $V_{E2}$ at which they may occur during the operation of the converter 10. It should be remembered the signals A, B, and C are processed through the preconditioning network 100 to form EXCLUSIVE-OR combinations with the signal D. Therefore, the combinations shown in association with the $V_{E2}$ voltage levels are inverted (to form their complements) prior to final error detection by the circuit 102. Consequently, each one of the four offset situations correlates with a single combination of the signals A'-C'. Further, if each of these situations is examined it would be apparent that correction simply involves inverting the $b_o$ bit of the digital word (see FIG. 7). This is the function provided by the circuit 26 as previously described.

Figure 11:
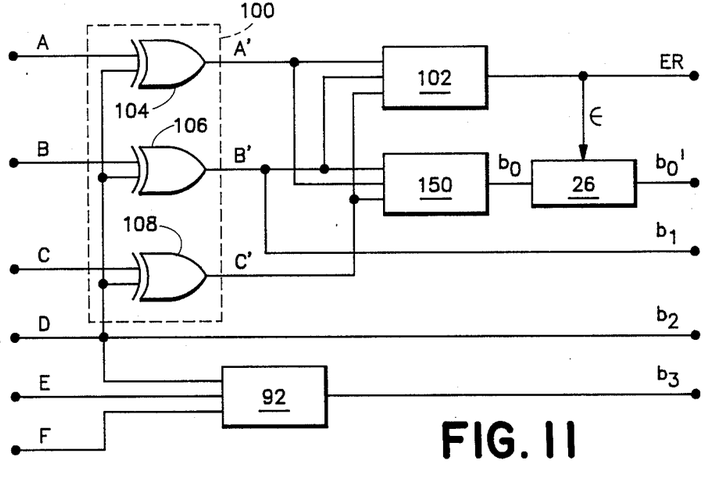
FIG. 11 is a combined schematic and block diagram of an alternate system which may be employed in decoding the output signals from the comparators of FIG. 1.

Referring now to FIG. 11, an alternative system for implementing the decoder network 20 of FIGS. 1 and 4 is shown. In particular, the least significant bit $b_o$ of the digital word is generated by a decoder subunit 150 from the inputs A', B', C' provided by the preconditioning circuit 100 previously described with respect to FIG. 6. The bit $b_1$ is provided directly from the output of the EXCLUSIVE-OR gate 106 of circuit 100 since the B' signal is identical with $b_1$ ($B \oplus D$). The bit $b_2$ is provided directly from the output D from the comparator 12d. The bit $b_3$ may be supplied by a circuit such as 92 as previously described with respect to decoder 20 in FIG. 4. The other components 102 and 26 shown in FIG. 10 are as previously described with respect to FIGS. 6 and 8.

Figure 12:
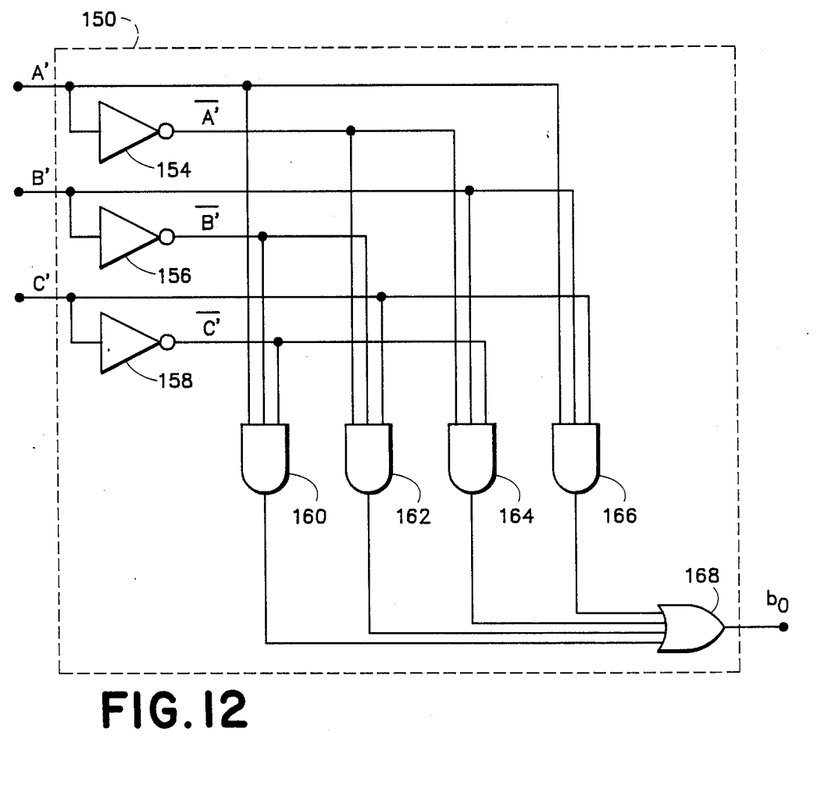
FIG. 12 is a schematic diagram of the circuitry for the component of the decoding system of FIG. 11 for generating the least significant bit of the digital output word.

The decoder subunit 150 is shown in greater detail in FIG. 12. The subunit 150 includes inverters 154, 156, and 158 for generating the complements of the signals A', B', and C'. The AND gates 160, 162, 164, and 166 generate signals ($A'\overline{B'}\overline{C'}=1$, $\overline{A'}\overline{B'}C'=1$, $\overline{A'}B'\overline{C'}=1$, $A'B'C'=1$) which correspond to conditions indicating the $b_o$ bit should be in the logic 1 state. The OR gate 168 provides a logic 1 signal whenever any of the signals from the AND gates 160, 162, 164, and 166 are in the logic 1 state, thereby forming the $b_o$ bit signal ($b_o$ = A'B'C' + $\overline{A}$'B'C' + $\overline{A}$'B'$\overline{C}$' + A'B'C').

Figure 13:
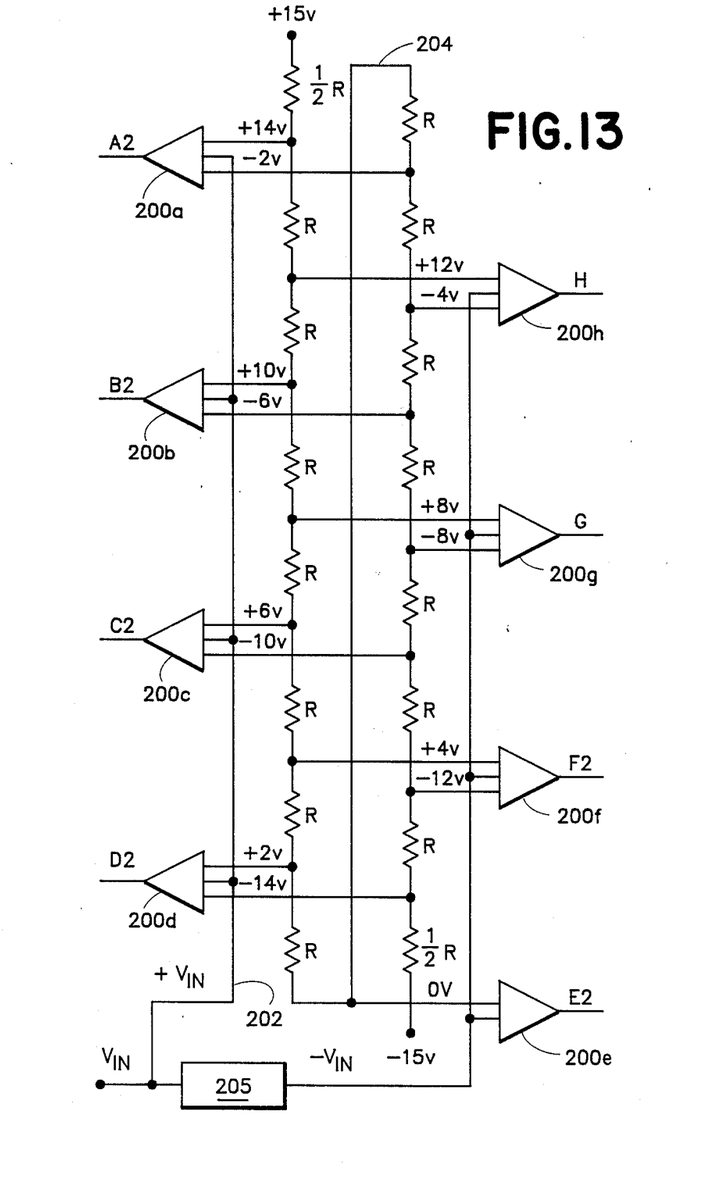
FIG. 13 is a schematic diagram of the circuitry for an alternative comparator system for use in the present invention.

Referring now to FIG. 13, the system of comparators employed in the present invention may be alternately structured as shown. The comparators 20a – 200h are divided into two sets. The first set of comparators 200a–200d receives the input signal $V_{IN}$ on line 202. The second set 200e–200h receives the input signal $-V_{IN}$ from an inverter 205 which inverts the analog input signal $V_{IN}$. The comparators 200a–200h operate in parallel and receive voltage reference signals from a common resistive network 204 which furnishes a series of reference voltages at two-volt increments to the comparators. The comparators 200a200d, 200f–200h are each provided with two reference voltages which define different 16-volt ranges ("windows") over which each of the comparators are operative to provide a logic 1 output signal. The sixteen-volt ranges of the different comparators 200a–200d, 200f–200h are separated by equal two-volt increments with all the ranges overlapping one another. The comparator 200e is provided with a zero voltage level reference signal.

Figure 14:
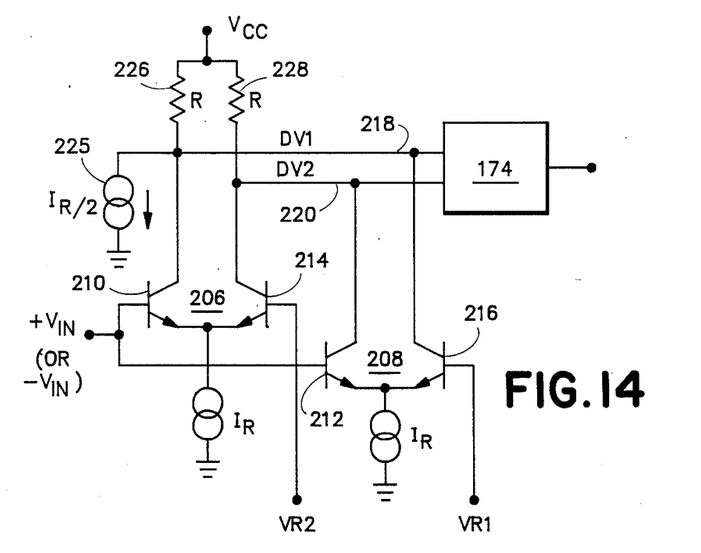
FIG. 14 is a schematic diagram of the circuitry for one of the comparators in the system of FIG. 13.

Referring now to FIG. 14, a circuit is shown for the comparators 200a–200d, 200f–200h which is similar to the circuit shown in FIG. 2 but includes only two differential amplifiers 206 and 208. The differential amplifiers 206 and 208 receive the analog inputs $V_{IN}$ (or $-V_{IN}$) at the base terminals for transistors 210 and 212 and receive reference voltages $V_{R1}$ and $V_{R2}$ at the base terminals for transistors 214 and 216, respectively. The collector terminals for the differential amplifiers 206 and 208 are connected to two common differential output conductors 218 and 220. However, the collector terminals for the "reference voltage receiving" transistors 214 and 216 are connected to opposite output conductors from the collector terminals for the "analog signal receiving" transistors 210 and 212. The collector terminals for transistors 210 and 216 are connected to conductor 218, and the collector terminals for transistors 212 and 214 are connected to conductor 220. The load resistors 226 and 228 are both of value "R" ohms and are connected between the conductors 218 and 220 and the source of voltage $V_{CC}$. However, the conductor 218 is also connected to the source 225 of constant current $I_R/2$.

Figure 15:
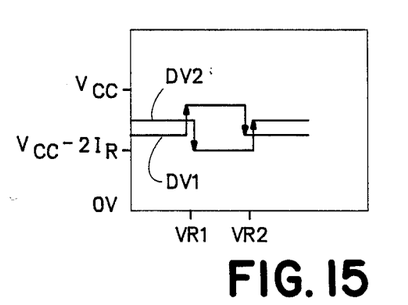
FIG. 15 is a chart depicting the signals on the common differential output conductors for the differential amplifiers in FIG. 14.

The differential signals DV1 and DV2 are generated on conductors 218 and 220 as shown in FIG. 15. The signals DV1 and DV2 change state at the voltage levels $V_{R1}$ and $V_{R2}$ with DV1>DV2 becoming DV2 >DV1 or DV2>DV1 becoming DV1>DV2 over the operational range of the converter 180. The common differential output conductors 218 and 220 are in turn connected to the buffer circuit 174 which may be identical to the circuit 74 shown in the upper right section of FIG. 2 and which converts the differential signals DV1 and DV2 to a single output $V_{OUT}$ referenced to ground ($V_{OUT}$ may be any one of A2, B2, C2, D2, F2, G, or H). The comparator 200e provides a conventional step function output signal E2 and is of standard design suitable for this application.

Figure 16:
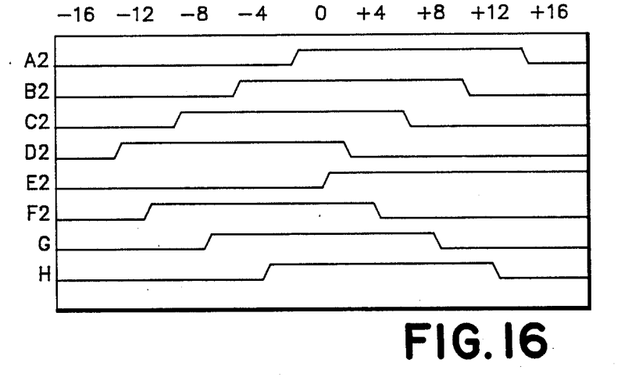
FIG. 16 is a chart depicting the waveforms for the logic states of the output signals of the comparators of FiG. 13.
Figure 18A:
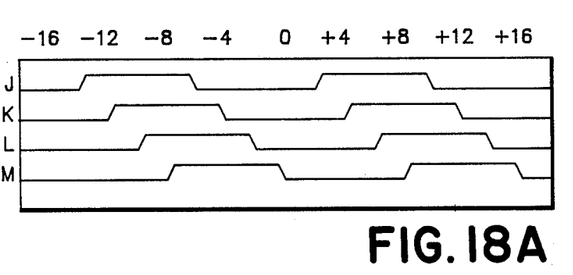
FIGS. 18A and 18B are charts depicting the waveforms for the logic states of the signals generated in the two stages of the preconditioning network of FIG. 17.
Figure 18B:
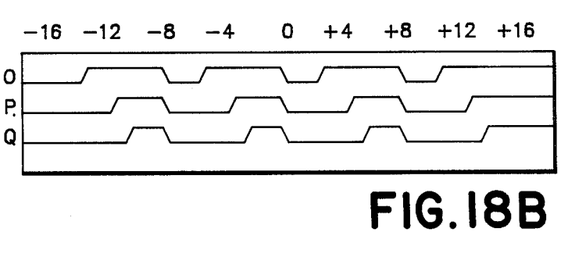

Referring now to FIG. 16, the output signals A2, B2, C2, D2, E2, F2, G, and H from the respective comparators 200a–200h are illustrated over the operational range +15 to −15 volts of the converter 180. These output signals each exhibit a single range or "window" over which they provide a logic 1 output signal (except E2). However, if a new set of signals is formed which represents the EXCLUSIVE-OR combinations J=B2⊕D2, K=F2 ⊕H, L=A2 ⊕C2 and M=G⊕E2, then these new signals exhibit two windows as shown in FIG. 18A. The waveforms of the signals J, K, L, and M are similar to the waveforms of the signals A–D plotted in FIG. 5A. Further, if these new signals are in turn used to form a final set of signals which represent the EXCLUSIVE-OR combinations 0=J⊕M, P=K⊕M and Q=L⊕M, then these final signals are characterized by waveforms as shown in FIG. 18B. These waveforms are similar to the waveforms shown in FIG. 5B, and the signals they represent may be employed in the same manner, through use of a circuit such as 102 of FIG. 6, for error detection and a circuit such as 26 for error correction. Therefore, a system for detecting errors in the outputs of the comparators 200a–200h may be implemented in a similar manner and with similar circuitry to the system shown in FIG. 6 except that the preconditioning circuit 100 must provide for a preliminary EXCLUSIVE-OR step in processing the signals A2-H.

Figure 17:
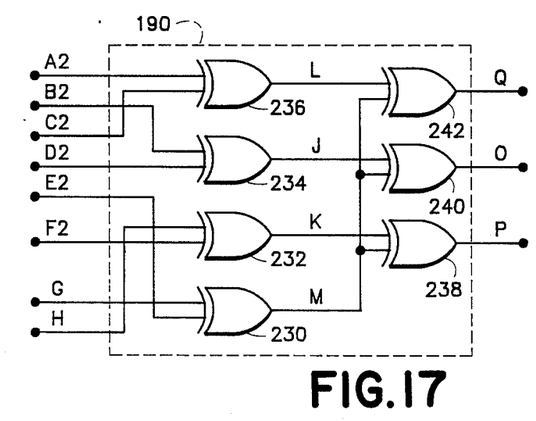
FIG. 17 is a schematic diagram of the circuitry for the preconditioning circuit required for processing the signals of the comparators of FIG. 13.

FIG. 17 illustrates a circuit 190 suitable for preconditioning the signals A2, B2, C2, D2, E2, F2, G, and H to provide signals O, P, and Q. The EXCLUSIVE-OR gates 230, 232, 234, and 236 provide the output signals J, K, L and M from the input signals A2, B2, C2, D2, E2, F2, G, and H. The EXCLUSIVE-OR gates 238, 240 and 242 provide the signals O, P, and Q, respectively, from the input signals J, K, L, and M. The signals O, P, and Q are equivalent to the signals A', B', C' produced in the converter 10 of FIG. 1, and the circuit 190 is, therefore, functionally equivalent to the circuit 100.

The foregoing description of the alternative system of comparators illustrates how the principles of error checking exemplified in the circuits 100 and 102 can be applied to other types of comparator systems with appropriate preconditioning of the output signals of comparators.

As may be apparent from the preceding descriptions, certain changes may be made in the above constructions without departing from the scope of the invention. Therefore, the embodiments described and the drawings are intended to be illustrative only and are not meant to be interpreted as limiting the following claims.

I claim:

1. An apparatus for converting an analog signal to a digital signal that is representative of the amplitude of the voltage of the analog signal, comprising:

a plurality of comparator means, each of such comparator means responsive to said analog signal for providing an output signal in one logic state over one or more different voltage ranges which overlap with the voltage ranges of one more of the other comparator means;

logic network means for decoding the outputs of said plurality of comparator means to generate said digital signal; and error checking means for processing the outputs of two or more of said comparator means to form two or more intermediate signals characterized over the operative range of the apparatus by regularly repeating patterns of logic state transitions and for processing said intermediate signals to provide an error signal indicative of when said intermediate signals correspond to combinations not allowed in accordance with the proper operation of the converter.

2. The apparatus of claim 1, further including:
means for correcting the digital signal provided by said means for decoding in accordance with the error signal provided by said error checking means.

3. The apparatus of claim 1, wherein:
said error detection means includes a preconditioning circuit for processing said outputs of said comparator means to form a set of three intermediate signals which are characterized by a pattern of logic state transitions repeated four times over the operating range of the apparatus.

4. The apparatus of claim 3, wherein:
said decoder means provides a digital binary word signal, and
said error correction means comprises an EXCLUSIVE-OR gate for receiving said error signal and the least significant bit in said digital word signal and for providing a corrected signal representing said least significant bit.

5. The apparatus of claim 1, wherein:
each of said comparator means comprises a plurality of differential amplifiers each of which amplifiers is adapted to receive said analog input and a different reference voltage input and each of which is connected to a pair of differential output conductors which are common to all of said amplifiers but which are connected to opposite terminals from alternate amplifiers.

6. The apparatus of claim 1, wherein:
said plurality of comparator means is comprised of two sets, one of which is adapted to receive as on input said analog signal and the other of which is adapted to receive as an input an inverted version of said analog signal.

7. An analog-to-digital converter comprising:
a plurality of voltage comparators for providing different output signals as a function of the voltage amplitude of an analog input signal;
means for decoding said output signals and providing a digital word signal corresponding to the voltage amplitude level of said analog input signal;
preconditioning means for forming intermediate signals representing different EXCLUSIVE-OR combinations of said output signals, said intermediate signals characterized by repeating waveform patterns over the operating range of said converter which are different in the case of each intermediate signal; and
detection means for providing an error signal indicative of when combinations of said intermediate signals correspond to combinations which should not occur during operation of said converter.

8. The analog-to-digital converter of claim 7, further including:
means for correcting said digital word signal in accordance with error signal.

9. In a flash analog-to-digital converter which includes a plurality of separate voltage comparators, a method for checking for errors in the output signals produced by said comparators, comprising the steps of:
generating a set of intermediate signals which represent different EXCLUSIVE-OR combinations of said output signals of said comparators and which are characterized by repeating waveform patterns in which said intermediate signals change to the same logic state at different voltage levels and all change to the complementary logic state at the same voltage level;
processing said intermediate signals through a logic network in order to detect when said intermediate signals are present in combinations of logic states which should not occur in accordance with the proper operation of said comparators; and
providing an error signal indicative of the occurrence of such combinations.

10. The method of claim 9, wherein:
said set of intermediate signals includes three separate signals having waveforms which are comprised of four repeating patterns and said logic network is operative for detecting four different combinations of logic state.

11. An analog-to-digital converter, comprising:
a plurality of comparators for generating output signals as a function of the amplitude of an analog signal voltage and each of which includes a set of differential amplifiers, each of said amplifiers adapted to receive as inputs said analog signal and a different reference voltage and connected to a pair of common differential output conductors with the output terminals of alternate amplifiers being connected to opposite conductors;
a decoder for receiving said comparator output signals and generating a digital word signal corresponding to the voltage amplitude of said analog input signal;
a preconditioning circuit for generating a set of intermediate waveforms representing EXCLUSIVE-OR combinations of said comparator output signals which are characterized by different repeating waveform patterns; and
a detection circuit for generating an error signal when said intermediate signals form combinations which should not occur in accordance with the proper operation of said converter.

12. The converter of claim 11, further including:
a logic circuit for correcting errors in the least significant bit in said digital word signal by generating a corrected signal representing an EXCLUSIVE-OR combination of said least significant bit signal and said error signal.

13. The converter of claim 11, further including:
inverter means for generating an inverted version of the analog signal;
and wherein:
said plurality of comparators includes two sets, one set adapted to receive said analog signal as an input and the other set adapted to receive said inverted analog signal as an input.

* * * * *